United States Patent
Ku et al.

(10) Patent No.: US 10,910,714 B2
(45) Date of Patent: Feb. 2, 2021

(54) CONFIGURABLE POWER COMBINER AND SPLITTER

(71) Applicant: QUALCOMM Incorporated, San Diego, CA (US)

(72) Inventors: Bon-Hyun Ku, San Diego, CA (US); Jeremy Dunworth, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 342 days.

(21) Appl. No.: 15/940,888

(22) Filed: Mar. 29, 2018

(65) Prior Publication Data

US 2019/0081399 A1    Mar. 14, 2019

Related U.S. Application Data

(60) Provisional application No. 62/557,089, filed on Sep. 11, 2017.

(51) Int. Cl.
*H01Q 5/335* (2015.01)
*H01Q 1/22* (2006.01)
(Continued)

(52) U.S. Cl.
CPC .......... *H01Q 5/335* (2015.01); *H01Q 1/2283* (2013.01); *H01Q 21/28* (2013.01); *H01Q 21/30* (2013.01);
(Continued)

(58) Field of Classification Search
CPC ...... H01Q 5/335; H01Q 1/2283; H01Q 21/28; H01Q 21/30; H03F 3/68
See application file for complete search history.

(56) References Cited

U.S. PATENT DOCUMENTS

| 4,132,865 A | 1/1979 | Szechenyi |
| 4,367,421 A | 1/1983 | Baker |
(Continued)

FOREIGN PATENT DOCUMENTS

| CN | 1647401 A | 7/2005 |
| CN | 1773844 A | 5/2006 |
(Continued)

OTHER PUBLICATIONS

Ahsan N., et al., "Dual Band Tunable LNA for Flexible RF Front End", IEEE, Proceedings of International Bhurban Conference on Applied Sciences and Technology (IBCAST 2007), (Jan. 1, 2007), pp. 19-22.

(Continued)

*Primary Examiner* — Peter M Bythrow
(74) *Attorney, Agent, or Firm* — Qualcomm Incorporated/Seyfarth Shaw LLP

(57) ABSTRACT

A signal processing circuit reduces die size and power consumption for each antenna element. The signal processing circuit includes a first set of ports, a third port, a first path, a second path and a first transistor. The first path is between a first port of the first set of ports and the third port. The second path is between a second port of the first set of ports and the third port. The first transistor is coupled between the first path and the second path. The first transistor is configured to receive a control signal to control the first transistor to adjust an impedance between the first path and the second path.

16 Claims, 11 Drawing Sheets

(51) Int. Cl.

| | | |
|---|---|---|
| *H01Q 21/30* | (2006.01) | |
| *H04B 1/00* | (2006.01) | |
| *H03H 7/48* | (2006.01) | |
| *H01Q 21/28* | (2006.01) | |
| *H04B 1/44* | (2006.01) | |
| *H03F 1/02* | (2006.01) | |
| *H03F 1/56* | (2006.01) | |
| *H03F 3/21* | (2006.01) | |
| *H03F 3/68* | (2006.01) | |
| *H03G 1/00* | (2006.01) | |
| *H04B 1/525* | (2015.01) | |
| *H01Q 21/06* | (2006.01) | |
| *H01Q 1/24* | (2006.01) | |

(52) U.S. Cl.
CPC ............ *H03F 1/0277* (2013.01); *H03F 1/56* (2013.01); *H03F 3/211* (2013.01); *H03F 3/68* (2013.01); *H03G 1/0088* (2013.01); *H03H 7/48* (2013.01); *H04B 1/006* (2013.01); *H04B 1/44* (2013.01); *H04B 1/525* (2013.01); *H01Q 1/246* (2013.01); *H01Q 21/062* (2013.01); *H01Q 21/065* (2013.01); *H03F 2200/27* (2013.01); *H03F 2200/294* (2013.01); *H03F 2200/405* (2013.01); *H03F 2200/451* (2013.01)

(56) References Cited

U.S. PATENT DOCUMENTS

| | | | |
|---|---|---|---|
| 4,628,274 A | 12/1986 | Vittoz et al. | |
| 4,810,911 A | 3/1989 | Noguchi | |
| 4,965,530 A | 10/1990 | Katz | |
| 5,731,607 A | 3/1998 | Kohama | |
| 5,754,082 A | 5/1998 | Swanson et al. | |
| 5,784,687 A | 7/1998 | Itoh et al. | |
| 5,808,502 A | 9/1998 | Hui et al. | |
| 5,818,099 A | 10/1998 | Burghartz | |
| 5,825,227 A | 10/1998 | Kohama et al. | |
| 5,883,541 A | 3/1999 | Tahara et al. | |
| 5,933,046 A | 8/1999 | Ramet et al. | |
| 6,094,088 A | 7/2000 | Yano | |
| 6,097,266 A | 8/2000 | Nardozza et al. | |
| 6,147,551 A | 11/2000 | Hong | |
| 6,166,584 A | 12/2000 | De | |
| 6,208,202 B1 | 3/2001 | Kaufman et al. | |
| 6,215,355 B1 | 4/2001 | Meck et al. | |
| 6,229,375 B1 | 5/2001 | Koen | |
| 6,356,536 B1 | 3/2002 | Repke | |
| 6,400,252 B1 | 6/2002 | Smith et al. | |
| 6,703,682 B2 | 3/2004 | Aswell | |
| 6,751,470 B1 | 6/2004 | Ella et al. | |
| 6,774,684 B2 | 8/2004 | Wu et al. | |
| 6,804,502 B2 | 10/2004 | Burgener et al. | |
| 6,864,746 B2 | 3/2005 | Cheah et al. | |
| 6,897,701 B2 | 5/2005 | Chen et al. | |
| 6,978,149 B1 | 12/2005 | Morelli et al. | |
| 7,023,272 B2 | 4/2006 | Hung et al. | |
| 7,088,971 B2 | 8/2006 | Burgener et al. | |
| 7,095,066 B2 | 8/2006 | Lavine | |
| 7,106,121 B2 | 9/2006 | Hidaka et al. | |
| 7,132,844 B2 | 11/2006 | Hashimoto | |
| 7,142,042 B1 | 11/2006 | Henry | |
| 7,161,423 B2* | 1/2007 | Paul ..................... | H03F 1/0205 330/251 |
| 7,167,044 B2 | 1/2007 | Zhenbiao et al. | |
| 7,173,471 B2 | 2/2007 | Nakatsuka et al. | |
| 7,199,635 B2 | 4/2007 | Nakatsuka et al. | |
| 7,236,044 B2 | 6/2007 | Talwalkar et al. | |
| 7,358,806 B2 | 4/2008 | Burns et al. | |
| 7,362,171 B2 | 4/2008 | Kunihiro | |
| 7,383,024 B2 | 6/2008 | Mueller et al. | |
| 7,385,445 B2 | 6/2008 | Wright | |
| 7,459,988 B1* | 12/2008 | Iversen ................... | H01P 1/15 327/430 |
| 7,486,135 B2 | 2/2009 | Mu | |
| 7,525,396 B2 | 4/2009 | He et al. | |
| 7,639,075 B2 | 12/2009 | Lin | |
| 7,642,859 B2* | 1/2010 | Shimada ................ | H03F 1/56 330/126 |
| 7,650,134 B2 | 1/2010 | Nakajima et al. | |
| 7,714,657 B2 | 5/2010 | Wu | |
| 7,719,352 B2 | 5/2010 | Kim et al. | |
| 7,738,841 B2 | 6/2010 | Ahn et al. | |
| 7,756,486 B1 | 7/2010 | Tan et al. | |
| 7,764,120 B2 | 7/2010 | Pengelly | |
| 7,801,556 B2 | 9/2010 | Tran et al. | |
| 7,848,712 B2 | 12/2010 | Fu et al. | |
| 7,890,063 B2 | 2/2011 | Ahn et al. | |
| 7,928,794 B2 | 4/2011 | Balboni | |
| 8,120,428 B2 | 2/2012 | Montalvo et al. | |
| 8,195,119 B2 | 6/2012 | Cassia et al. | |
| 8,229,367 B2 | 7/2012 | Chan et al. | |
| 8,232,850 B2 | 7/2012 | Rofougaran et al. | |
| 8,395,435 B2 | 3/2013 | Cassia et al. | |
| 8,791,771 B2 | 7/2014 | Ding et al. | |
| 8,913,976 B2 | 12/2014 | Khatri et al. | |
| 9,124,354 B2 | 9/2015 | Ganti et al. | |
| 9,190,699 B2 | 11/2015 | Granger-Jones et al. | |
| 9,373,879 B2 | 6/2016 | Ehyaie | |
| 9,397,720 B2 | 7/2016 | Jerng et al. | |
| 9,735,469 B1 | 8/2017 | West et al. | |
| 10,116,347 B1 | 10/2018 | Xu | |
| 10,693,231 B2 | 6/2020 | Dunworth et al. | |
| 2001/0050951 A1 | 12/2001 | Dellon et al. | |
| 2003/0112065 A1 | 6/2003 | Brown et al. | |
| 2004/0113746 A1 | 6/2004 | Brindle | |
| 2004/0246051 A1 | 12/2004 | Hsu et al. | |
| 2005/0014473 A1 | 1/2005 | Zhao et al. | |
| 2005/0197084 A1 | 9/2005 | Hamasaki et al. | |
| 2006/0189286 A1 | 8/2006 | Kyu et al. | |
| 2006/0199563 A1 | 9/2006 | Kelly et al. | |
| 2006/0202752 A1 | 9/2006 | Stephelbauer et al. | |
| 2006/0217090 A1 | 9/2006 | Pan | |
| 2006/0267666 A1 | 11/2006 | Toda | |
| 2007/0049237 A1 | 3/2007 | Miura et al. | |
| 2007/0060066 A1 | 3/2007 | Srinivasan | |
| 2007/0069291 A1 | 3/2007 | Stuber et al. | |
| 2007/0222523 A1 | 9/2007 | Arell | |
| 2007/0232241 A1 | 10/2007 | Carley et al. | |
| 2007/0281629 A1 | 12/2007 | Ahn et al. | |
| 2007/0290744 A1 | 12/2007 | Adachi et al. | |
| 2008/0064358 A1 | 3/2008 | Sagae et al. | |
| 2008/0290928 A1* | 11/2008 | Kawakyu ............. | H03K 17/005 327/429 |
| 2009/0045877 A1 | 2/2009 | Wang et al. | |
| 2010/0117713 A1* | 5/2010 | Katoh .................. | H03K 17/063 327/427 |
| 2010/0237945 A1 | 9/2010 | Cassia et al. | |
| 2010/0295629 A1 | 11/2010 | Klemens et al. | |
| 2011/0001544 A1* | 1/2011 | Ranta ...................... | H03J 3/20 327/427 |
| 2011/0025403 A1* | 2/2011 | Cassia ................. | H03K 17/102 327/434 |
| 2011/0025404 A1 | 2/2011 | Cassia | |
| 2011/0148503 A1* | 6/2011 | Granger-Jones ......... | H03L 5/00 327/308 |
| 2011/0176245 A1 | 7/2011 | Worley et al. | |
| 2011/0260774 A1 | 10/2011 | Granger-Jones et al. | |
| 2011/0260780 A1 | 10/2011 | Granger-Jones et al. | |
| 2014/0199951 A1 | 7/2014 | Yu et al. | |
| 2015/0333791 A1* | 11/2015 | Anderson ................ | H04B 1/48 455/83 |
| 2016/0126921 A1* | 5/2016 | Hur ....................... | H03F 1/0288 343/852 |
| 2017/0047667 A1* | 2/2017 | Sarkar ...................... | H01P 5/16 |
| 2017/0214417 A1 | 7/2017 | Jian | |

(56) References Cited

U.S. PATENT DOCUMENTS

| | | | |
|---|---|---|---|
| 2019/0081399 A1 | 3/2019 | Ku et al. | |
| 2019/0081596 A1 | 3/2019 | Dunworth et al. | |

FOREIGN PATENT DOCUMENTS

| | | |
|---|---|---|
| CN | 1841923 A | 10/2006 |
| CN | 101369803 A | 2/2009 |
| CN | 101369803 B | 5/2011 |
| DE | 102008004861 | 7/2009 |
| DE | 102008004861 A1 | 7/2009 |
| EP | 1560331 A1 | 8/2005 |
| EP | 1693957 A1 | 8/2006 |
| EP | 1708361 A2 | 10/2006 |
| EP | 1793493 A1 | 6/2007 |
| JP | H08307305 A | 11/1996 |
| JP | H10242826 A | 9/1998 |
| JP | 2001160724 A | 6/2001 |
| JP | 2001217701 A | 8/2001 |
| JP | 2002057599 A | 2/2002 |
| JP | 2004015409 A | 1/2004 |
| JP | 2006050074 A | 2/2006 |
| JP | 2006237711 A | 9/2006 |
| JP | 2006279963 A | 10/2006 |
| JP | 2006332778 A | 12/2006 |
| JP | 2008011120 A | 1/2008 |
| JP | 2008294726 A | 12/2008 |
| JP | 2009010826 A | 1/2009 |
| JP | 2009065304 A | 3/2009 |
| KR | 20040074278 A | 8/2004 |
| TW | I224418 B | 11/2004 |
| WO | 2007085866 A1 | 8/2007 |
| WO | 2007105282 A1 | 9/2007 |
| WO | 2008103757 A1 | 8/2008 |
| WO | 2008145604 A1 | 12/2008 |
| WO | 2009009494 A2 | 1/2009 |
| WO | 2010132699 A1 | 11/2010 |
| WO | 2011019850 A1 | 2/2011 |
| WO | 2011091064 A1 | 7/2011 |

OTHER PUBLICATIONS

Bloom I., et al., "1/F Noise Reduction of Metal-Oxide-Semiconductor Transistors by Cycling from Inversion to Accumulation", Applied Physics Letters, AIP Publishing LLC, US, vol. 58, No. 15, Apr. 15, 1991 (Apr. 15, 1991), pp. 1664-1666, XP000208382, ISSN: 0003-6951, DOI: 10.1063/1.105130.

Henzler S., et al., "Power Management of Digital Circuits in Deep Sub-Micron CMOS Technologies", Nov. 24, 2006 (Nov. 24, 2006), pp. 61-62, XP055580276.

Jin Y., et al, "Ultra-compact high-linearity high-powerfully integrated DC-20-GHz 0.18-μm CMOS T/R switch", IEEE Transactions on Microwave Theory and Techniques, vol. 55, Issue. 1, Feb. 2007, pp. 30-36.

Kuhn W.B., et al., "A Resonant Switch for LNA Protection in Watt-Level CMOS Transceivers", IEEE Transactions on Microwave Theory and Techniques, vol. 53, Issue: 9, Sep. 2005, pp. 2819-2825.

Liscidini A., et al., "A 0.13 μm CMOS Front-End, for Dcs1800/UMTS/802.11b-g With Multiband Positive Feedback Low-Noise Amplifier", Solid-State Circuits, IEEE Journal of, vol. 41, No. 4, Apr. 2006, pp. 981-989.

Moreira C.P., et al., "A Reconfigurable DCS1800/W-CDMA LNA: Design and Implementation Issues", IEEE, Proceedings of the 36th European Microwave Conference, 2006, (Sep. 1, 2006), pp. 1652-1655.

Yao W., "Digital Controlled Antenna and Antenna Array in Wireless Communication", University of California Los Angeles, 2005, 24 pages.

Balducci M., et al., "Ka Band Passive Differential 4:1 Power Divider/combiner Based on Wilkinson Topology", 2017 13th Conference on Ph.d. Research in Microelectronics and Electronics (PRIME), IEEE, Jun. 12, 2017, XP033119699, DOI: 10.1109/PRIME.2017.7974139 [retrieved on Jul. 10, 2017], pp. 189-192.

Chung Y., et al., "Power Routing Scheme With Dual Operating Modes: Two-Way Wilkinson Divider and One-way Signal Path", Electronics Letters, Jan. 1, 2004, vol. 40, No. 2, pp. 129-130, XP055516490, GB ISSN: 0013-5194, DOI: 10.1049/el:20040082.

International Search Report and Written Opinion—PCT/US2018/046282—ISA/EPO—dated Nov. 6, 2018.

Chen H-S., et al., "A 52-GHz Full-Integrated RF Front-End by T/R Switch, LNA, and PA Co-Design with 3.2-dB NF and +25.9-dBm Output Power", IEEE Asian Solid-State Circuits Conference, Nov. 2015, 4 Pages.

Huang C-W.P., et al., "Novel double pole double throw switchplexer that simplifies dual-band WLAN and MIMO front-end module designs," Microwave Symposium Digest, 2008 IEEE MTT-S International, Jun. 15-20, 2008, pp. 1183-1186.

International Search Report and Written Opinion—PCT/US2010/044032, International Search Authority—European Patent Office—dated Oct. 8, 2010.

Co-pending U.S. Appl. No. 60/634,977, filed Dec. 9, 2004.

* cited by examiner

CONFIGURABLE POWER COMBINER AND SPLITTER

CROSS-REFERENCE TO RELATED APPLICATION

The present application claims the benefit of U.S. Provisional Patent Application No. 62/557,089, filed on Sep. 11, 2017, and titled "CONFIGURABLE POWER COMBINER AND SPLITTER," the disclosure of which is expressly incorporated by reference herein in its entirety.

TECHNICAL FIELD

The present disclosure generally relates to a phased-array front-end. More specifically, the present disclosure relates to a configurable power combiner and splitter (CPCS) for fifth generation (5G) millimeter wave front-ends.

BACKGROUND

Mobile radio frequency (RF) chip designs (e.g., mobile RF transceivers) have migrated to deep sub-micron process nodes due to cost and power consumption considerations. The design complexity of mobile RF transceivers is further complicated by added circuit function and devices to support communication enhancements. For example, the advances in technology have resulted in cellular communication standards and protocols, such as 5G new radio (NR) millimeter wave using physically small antenna arrays that contain multiple antenna elements.

It is desirable to configure the number of antenna elements to adapt to operation of an electronic device or user equipment. For example, a first number of antenna elements may be used in certain modes of operation, and a second number of antenna elements may be used in a different mode of operation. Some systems provide configurable antenna arrays by selectively shutting off power to active elements (e.g., power amplifiers (PAs) and low noise amplifiers (LNAs)) coupled to the antennas. However, a summing/distribution network of a radio frequency integrated circuit (RFIC) is typically implemented via a non-configurable passive element, such as a Wilkinson power combiner or classical Wilkinson device or a resistive power splitter, which suffers increased insertion loss and thus higher power consumption.

SUMMARY

In an aspect of the present disclosure, a signal processing circuit includes a first set of ports and a third port. The signal processing circuit also includes a first path between a first port of the first set of ports and the third port. The signal processing circuit further includes a second path between a second port of the first set of ports and the third port. Furthermore, the signal processing circuit includes a first transistor coupled between the first path and the second path. The first transistor is configured to receive a control signal to control the first transistor to adjust an impedance between the first path and the second path.

In an aspect of the present disclosure, a signal processing circuit includes a first set of ports and a third port. The signal processing circuit also includes a first path between a first port of the first set of ports and the third port. The signal processing circuit further includes a second path between a second port of the first set of ports and the third port. Furthermore, the signal processing circuit includes means for adjusting an impedance between the first path and the second path. The impedance adjusting means is coupled between the first path and the second path. The impedance adjusting means is configured to receive a control signal to cause the impedance adjusting means to adjust the impedance between the first path and the second path.

In yet another aspect of the present disclosure, a signal processing circuit operation method includes controlling a first transistor coupled between a first path and a second path of a configurable power combiner and splitter to create an impedance between the first path and the second path when operating in a combiner mode. The first path and the second path are established between a first set of ports coupled to a set of antennas and a third port coupled to a transceiver. The method further includes controlling the first transistor to decouple the first path from the second path when operating in a switch mode.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Currently developing next generation cellular technologies (5G) in millimeter wave (mmW) bands desire low cost phased-array transceivers. Even with the benefit of beam forming, due to space constraints in a mobile form factor, increasing transmit output power while maintaining acceptable power added efficiency (PAE) of a power amplifier (PA), noise factor (NF) of a low noise amplifier (LNA), and overall transceiver power consumption, it is important to maximize link budget allowable path loss and to minimize handset case temperature. Additionally, the phased-array transceiver is specified to support dual polarization communication. To facilitate using arrays of transceivers to create customer premises equipment or base station size antenna arrays, an intermediate frequency (IF) interface is desirable so that a low loss IF power combining and splitting network can be implemented on an antenna substrate or on a backplane that carries multiple antenna module tiles.

Aspects of the present disclosure include a radio frequency integrated circuit (RFIC) that significantly reduces die size and power consumption per antenna element compared to the other solutions (e.g., silicon germanium (SiGe) solutions). The present disclosure also improves transmit power output and noise figure in comparable area per antenna element compared to silicon germanium bipolar heterojunction transistor complementary metal oxide semiconductor (BiCMOS) solutions. The RFIC, according to aspects of the disclosure, also supports switching or combining among three four-channel sub-array groups in each polarization enabling both smartphone and small cell applications to be served with a single radio frequency integrated circuit (RFIC) design.

Figure 6:
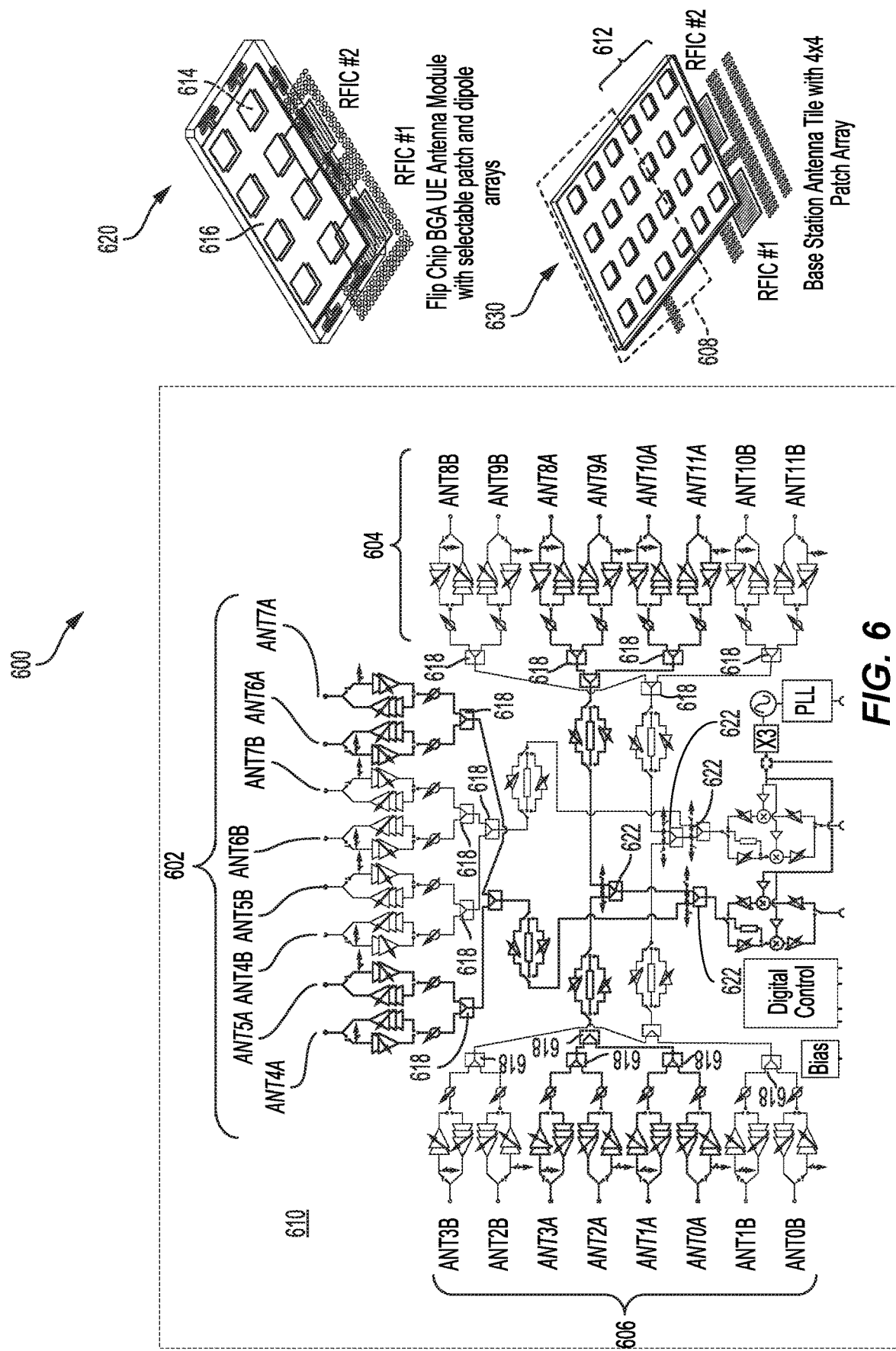
FIG. 6 illustrates an example of a radio frequency integrated circuit (RFIC) architecture and exploded views of two antenna modules into which the radio frequency integrated circuit is integrated.

In one aspect of the disclosure, a radio frequency integrated circuit (e.g., transceiver) including a power combiner and splitter may include one or more configurable power combiner and splitter (CPCS). A first configurable power combiner and splitter includes a first transistor coupled between a first path and a second path. In one aspect of the disclosure, the first transistor is coupled between a first resistor and a second resistor. The inclusion of this transistor is beneficial because the CPCS can be configured as either a power combiner/splitter or a switch. The first path and the second path are established between a first set of ports coupled to multiple antennas and a third port coupled to a transceiver. For example, the antenna may be a user equipment antenna module with selectable patch and dipole arrays, as shown in FIG. 6. Alternatively, the antenna may be a base station antenna tile with a patch array configuration, also shown in FIG. 6.

The first configurable power combiner and splitter receives a first control signal provided by a control device. The first control signal controls the first transistor to adjust an impedance between the first path and the second path. The adjusted impedance includes a characteristic impedance in a combiner mode. Further, the first control signal causes the first transistor to decouple the first path from the second path in a switch mode. In the combiner mode, the first path and the second path are in operation. However, in the switch mode only one path (e.g., the first path or the second path) is in operation. For example, in the switch mode, radio frequency signals for wireless communication are only received or transmitted through the first path or the second path.

In one aspect, the first configurable power combiner and splitter may have a differential configuration such that the first path is a first differential path and the second path is a second differential path. For example, the first differential path may include a first sub-path and a second sub-path of different polarities. The first differential path may be established between a first differential port (e.g., two ports with different polarities) of the first set of ports and a third differential port (e.g., the third port and a fourth port) coupled to the transceiver. Similarly, the second differential path may also include a third sub-path and a fourth sub-path of different polarities. The second differential path may be established between a second differential port of the first set of ports and the third differential port.

The first configurable power combiner and splitter includes a first transformer in the first differential path configured to inductively couple the first sub-path and the second sub-path. Similarly, a second transformer is included in the second differential path to inductively couple the third sub-path and the fourth sub-path.

The first configurable power combiner and splitter also includes a second transistor and a third transistor. The second transistor is coupled in shunt to the first path. For example, the second transistor is coupled between the first path and a ground. The third transistor is coupled in shunt to the second path. For example, the third transistor is coupled between the second path and the ground.

The first configurable power combiner and splitter also receives a second control signal and a third control signal. The first, second, and third control signals may be provided by the same control device. The second control signal causes the second transistor to disable in the combiner mode or causes the second transistor to short the first path to ground in the switch mode. The third control signal causes the third transistor to disable in the combiner mode or causes the third transistor to short the second path to ground in the switch mode.

In some aspects of the disclosure, the power combiner and splitter further includes a second configurable power combiner and splitter coupled to a first of the first set of ports, and a third configurable power combiner and splitter coupled to a second of the first set of ports.

In one aspect of the disclosure, the transistors include N-type metal oxide semiconductor (NMOS) transistors. Alternatively, the transistors may be P-type metal oxide semiconductor (PMOS) transistors, or a combination of P-type and N-type metal oxide semiconductor transistors.

Figure 1:
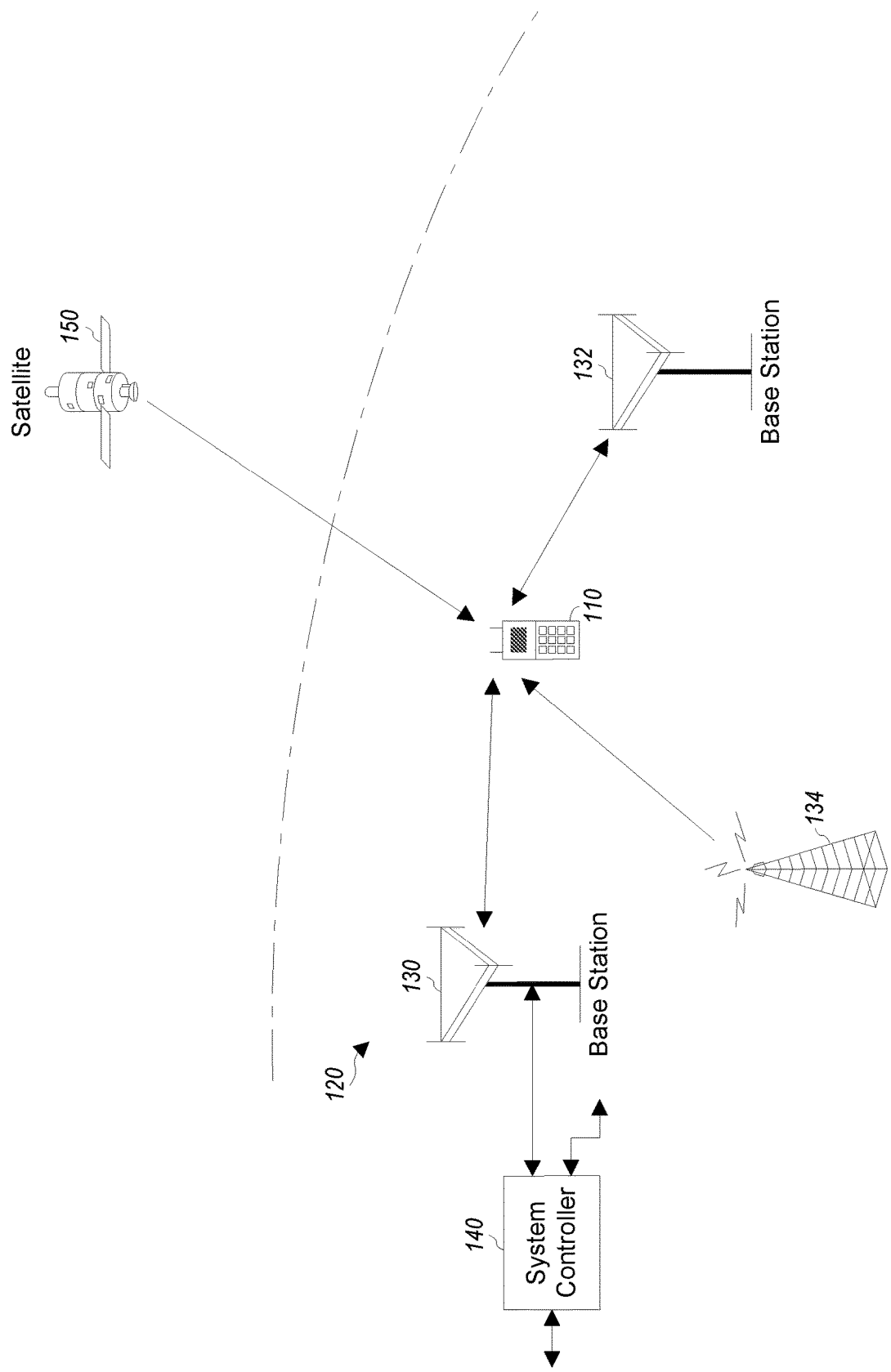
FIG. 1 shows a wireless device communicating with a wireless communication system.
Figure 9:
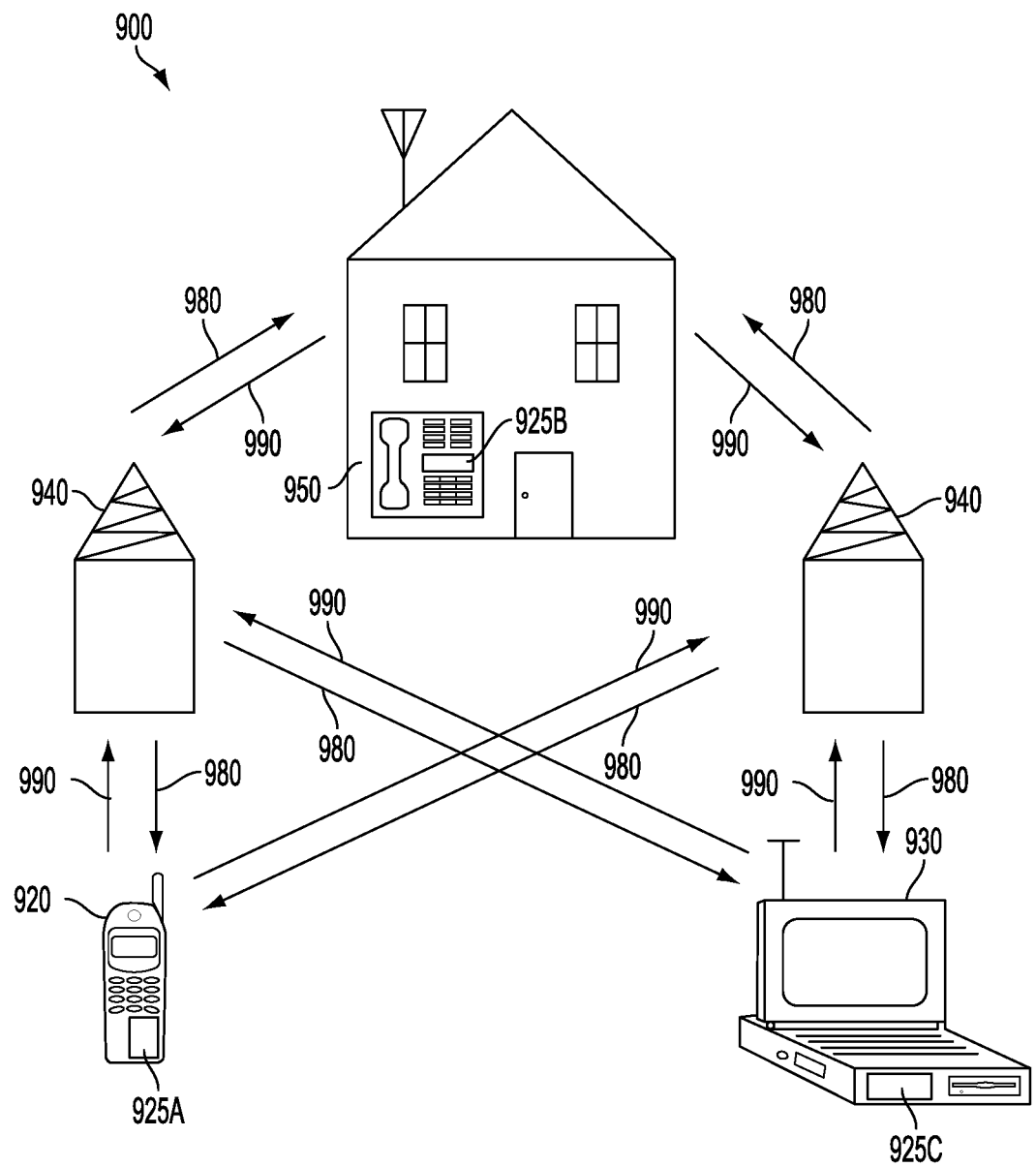
FIG. 9 is a block diagram showing an exemplary wireless communication system in which a configuration of the disclosure may be advantageously employed.

The aspects of the present disclosure may be implemented in the system of FIGS. 1 and 9. More specifically, aspects of the present disclosure may be implemented in the wireless device of FIG. 2.

FIG. 1 shows a wireless device 110 communicating with a wireless communication system 120. The wireless device 110 includes a configurable power combiner and splitter (CPCS) for fifth generation (5G) millimeter wave front-ends. The wireless communication system 120 may be a 5G system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
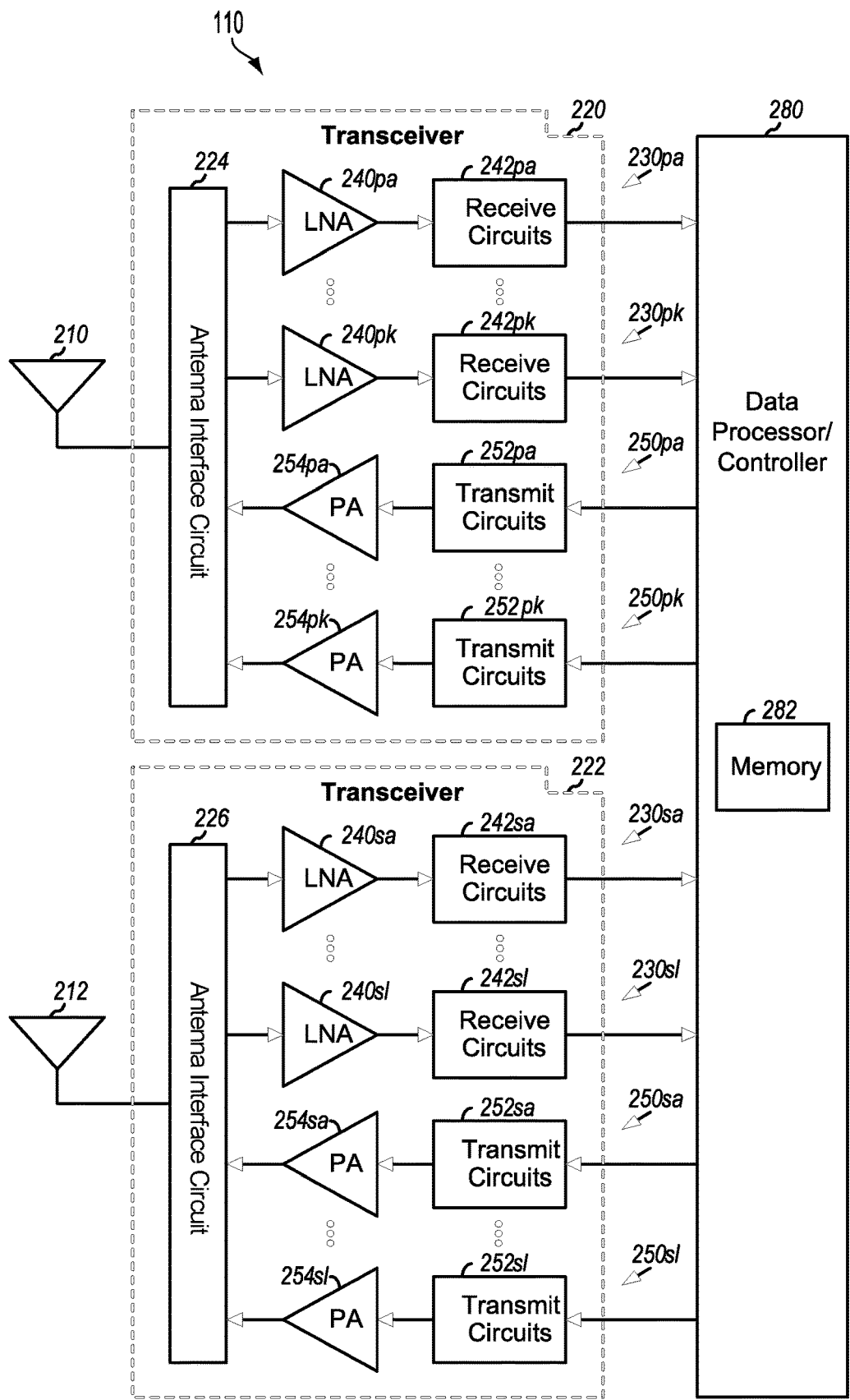
FIG. 2 shows a block diagram of the wireless device in FIG. 1, according to an aspect of the present disclosure.

FIG. 2 shows a block diagram of an exemplary design of the wireless device 110 in FIG. 1. In this exemplary design, the wireless device 110 includes a transceiver 220 coupled to a primary antenna 210, a transceiver 222 coupled to a secondary antenna 212, and a data processor/controller 280. The transceiver 220 includes multiple (K) receivers 230pa to 230pk and multiple (K) transmitters 250pa to 250pk to support multiple frequency bands, multiple radio technologies, carrier aggregation, etc. The transceiver 222 includes L receivers 230sa to 230sl and L transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, the antenna 210 receives signals from base stations and/or other transmitter stations and provides a received radio frequency (RF) signal, which is routed through an antenna interface circuit 224 and presented as an input RF signal to a selected receiver 230. An antenna interface circuit 224 may include switches, duplexers, transmit filters, receive filters, matching circuits, etc. The description below assumes that the receiver 230pa is the selected receiver. Within the receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in the transceivers 220 and 222 may operate in a similar manner as the receiver 230pa.

In the exemplary design shown in FIG. 2, each transmitter 250 includes transmit circuits 252 and a power amplifier (PA) 254. For data transmission, a data processor 280 processes (e.g., encodes and modulates) data to be transmitted and provides an analog output signal to a selected transmitter. The description below assumes that the transmitter 250pa is the selected transmitter. Within the transmitter 250pa, transmit circuits 252pa amplify, filter, and upconvert the analog output signal from baseband to RF and provide a modulated RF signal. The transmit circuits 252pa may include amplifiers, filters, mixers, matching circuits, an oscillator, an LO generator, a PLL, etc. A power amplifier (PA) 254pa receives and amplifies the modulated RF signal and provides a transmit RF signal having the proper output power level. The transmit RF signal is routed through the antenna interface circuit 224 and transmitted via the antenna 210. Each remaining transmitter 250 in the transceivers 220 and 222 may operate in a similar manner as the transmitter 250pa.

FIG. 2 shows an exemplary design of a receiver 230 and transmitter 250. The receiver 230 and a transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple ICs, as described below. The circuits in transceivers 220 and 222 may also be implemented in other manners.

The data processor/controller 280 may perform various functions for the wireless device 110. For example, the data processor 280 may perform processing for data being received via the receivers 230 and data being transmitted via the transmitters 250. The controller 280 may control the operation of the various circuits within the transceivers 220 and 222. In some aspects, the transceivers 220 and 222 may also comprise a controller to control various circuits within the respective transceiver (e.g., LNAs 240). A memory 282 may store program codes and data for the data processor/controller 280. The data processor/controller 280 may be implemented on one or more application specific integrated circuits (ASICs) and/or other ICs.

In some implementations, the LNAs and PAs of the exemplary transceiver 220 and/or the exemplary transceiver 222 of FIG. 2 may also be implemented as one or more arrays of LNAs and PAs for a phased array transceiver (e.g., as described with reference to FIG. 6). Phased array transceivers are used for higher frequency communication such as 30 GHz and 60 GHz to achieve the benefits of beam forming.

Figure 3:
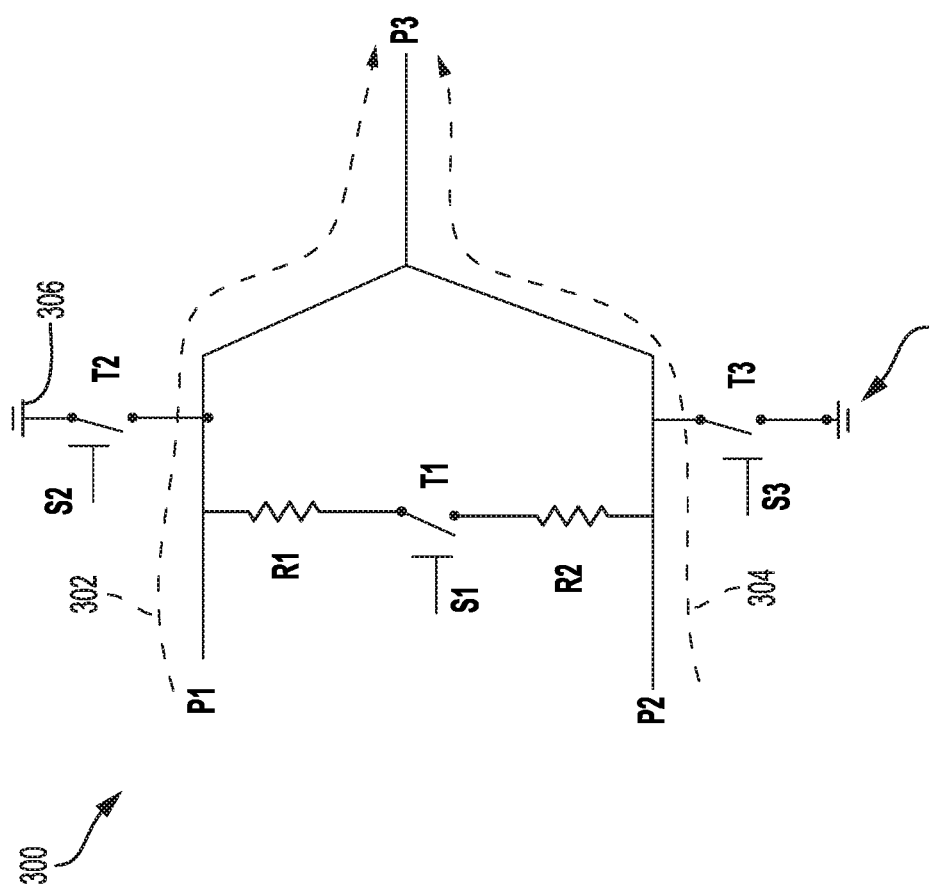
FIG. 3 illustrates an example of a configurable power combiner and splitter (CPCS), according to an aspect of the present disclosure.

FIG. 3 illustrates an example of a configurable power combiner and splitter (CPCS) 300 according to an aspect of the present disclosure. The CPCS 300 includes a first switch T1, a second switch T2, a third switch T3, a first single-ended port P1, a second single-ended port P2, a third single-ended port P3, a first resistor R1, a second resistor R2, a ground 306, and a control signal S1 provided to the first switch T1 to control the first switch T1. Whether the circuit is combining or splitting depends on whether the first single-ended port P1 and the second single-ended port P2 in FIG. 3 (combining) are considered inputs or the third single-ended port P3 in FIG. 3 (splitting) is considered the input. For example, in switch mode, there is a connection between either the first single-ended port P1 and the third single-ended port P3 or the second single-ended port P2 and the third single-ended port P3, but not between all three nodes.

For example, the control signal S1 may be an inverted signal and may include a first inverted control signal $\overline{Sch1}$ for one mode of operation and a second inverted control signal $\overline{Sch2}$ for another mode of operation. For example, S1 may be the logical OR of the control signals $\overline{Sch1}$ and $\overline{Sch2}$. A control signal S2 may be used to control the second switch T2 and a control signal S3 may be used to control the third switch T3. The control signals S2 and S3 may each include a first inverted control signal (e.g., an inverted control signal $\overline{Sch3}$) and a second inverted control signal (e.g., an inverted control signal $\overline{Sch4}$). For example, the inverted control signal $\overline{Sch3}$ may be used to control the second switch T2 in one mode of operation and the inverted control signal $\overline{Sch4}$ may be used to control the third switch T3 in the mode of operation.

The CPCS 300 includes a first single-ended path 302 and a second single-ended path 304. The first switch T1 is coupled between the first single-ended path 302 and the second single-ended path 304. The first single-ended path 302 and the second single-ended path 304 are established between a first set of ports (e.g., single-ended ports P1 and P2) coupled to a multiple antennas (not shown) and the third single-ended port P3 coupled to a transceiver (not shown).

In a combiner/splitter mode, the first switch T1 is controlled to create a characteristic impedance between the first single-ended path 302 and the second single-ended path 304. In a switch mode, the first switch T1 is controlled to decouple the first single-ended path 302 from the second single-ended path 304. The second switch T2 is coupled in shunt to the first single-ended path 302. The second switch T2 is controlled such that it OFF (or open when T2 is a transistor) in the combiner mode. In the switch mode, however, the second switch T2 is controlled such that it shorts the first single-ended path 302 to ground 306 when the second single ended path 304 is selected in the switch mode. Otherwise when the first single ended path 302 is selected in the switch mode, the second switch T2 is OFF (or open/disabled when T2 is a transistor) as in the combiner/splitter mode.

Similarly, the third switch T3 is coupled in shunt to the second single-ended path 304. The third switch T3 is controlled such that it is OFF (or open when T3 is a transistor) in the combiner mode. In the switch mode, however, the third switch T3 is controlled such that it shorts the second single-ended path 304 to ground 306 when the first single ended path 302 is selected in the switch mode. Otherwise, when the second single ended path 304 is selected in the switch mode, the third switch T3 is controlled such that it is disabled, as in the combiner mode. While T1, T2 and T3 are represented as switches in FIGS. 3, T1, T2 and T3 can also be represented as transistors that are configured to operate as switches. Thus, similar to the switches that can be turned ON and OFF, the transistors can be open when a "0" signal is applied to gates of the transistors and closed when a "1" is applied to gates of the transistors.

Figure 4A:
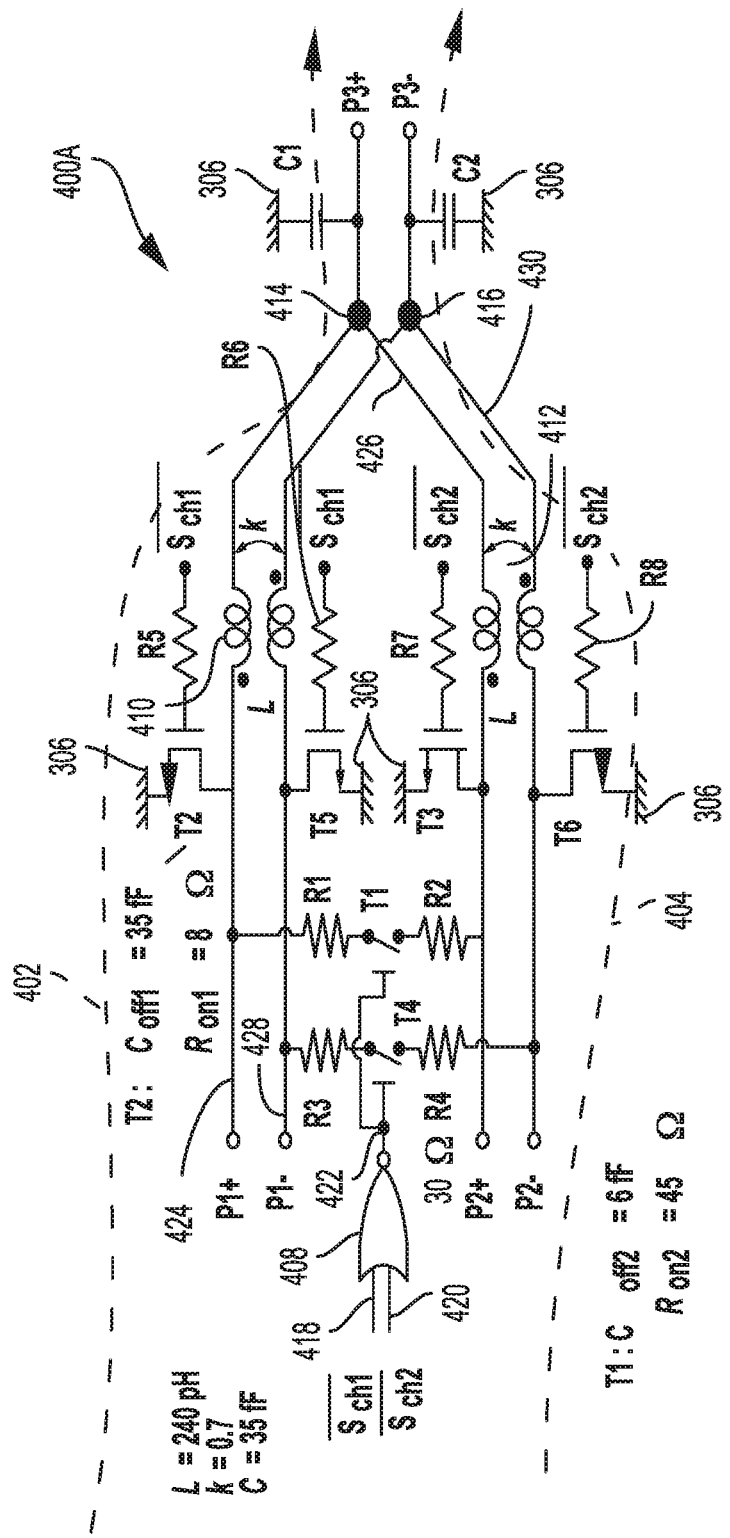
FIG. 4A illustrates an example of a differential configurable power combiner and splitter (CPCS), according to an aspect of the present disclosure.

FIG. 4A illustrates an example of a differential configurable power combiner and splitter (CPCS) 400A, according to an aspect of the present disclosure. The differential CPCS 400A is a two way CPCS. For illustrative purposes, some of the labelling and numbering of the devices and features of FIG. 4A are similar to those of FIG. 3. For example, the CPCS 400A of FIG. 4A includes the first switch T1, the second transistor T2, the third transistor T3, the first resistor R1, the second resistor R2 and the ground 306. However, the CPCS 400A is configured in accordance with a differential configuration and therefore includes other transistors, resistors, and devices. For example, the CPCS 400A further includes a fourth switch T4, a fifth transistor T5, a sixth transistor T6, a first CPCS port P1+, a second CPCS port P1−, a third CPCS port P2+, a fourth CPCS port P2−, a fifth CPCS port P3+, a sixth CPCS port P3−, a third resistor R3, a fourth resistor R4, a fifth resistor R5, a sixth resistor R6, a seventh resistor R7, an eighth resistor R8, a first capacitor C1, a second capacitor C2, and a control/logic device 408.

Figure 4B:
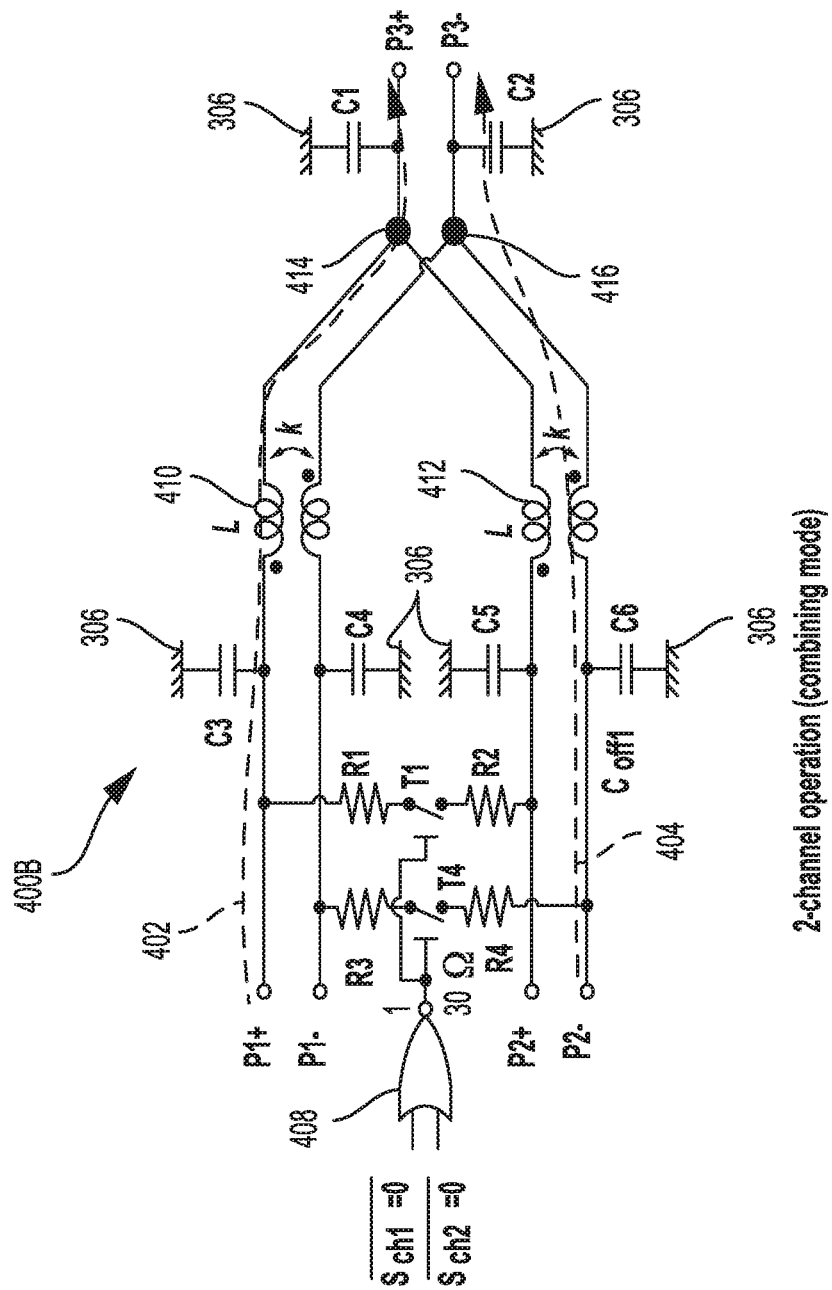
FIG. 4B illustrates an example of a differential configurable power combiner and splitter (CPCS) in a combining mode, according to an aspect of the present disclosure.

While T1 and T4 are represented as switches in FIGS. 4A and 4B, T1 and T4 can also be represented as transistors that are configured to operate as switches. Thus, similar to the switches that can be turned ON and OFF, the transistors can be open when a "0" signal is applied to gates of the transistors and closed when a "1" is applied to gates of the transistors.

The first capacitor C1 may have a same capacitance as the second capacitor C2. The first CPCS port P1+ and the second CPCS port P1− form a first differential port, the third CPCS port P2+ and the fourth CPCS port P2− form a second differential port and the fifth CPCS port P3+ and the sixth CPCS port P3− form a third differential port.

The logic device 408 includes input terminals 418 and 420 and an output terminal 422. The output terminal 422 of the logic device 408 is coupled to the switches T1 and T4. The logic device 408 processes control signals such as the first inverted control signal $\overline{Sch1}$ and the second inverted control signal $\overline{Sch2}$. For example, the logic device 408 receives control signals S (e.g., $\overline{Sch1}$ and $\overline{Sch2}$) at the input terminals 418 and 420 and propagates a resultant control signal from the output terminal 422 to the switches T1 and T4 to control the switches T1 and T4. A control signal (e.g., $\overline{Sch1}$ or $\overline{Sch2}$) is also provided to the switches T2, T3, T5, and T6 to control the transistors to achieve a particular mode of operation of the CPCS 400A. For example, the control signal is provided to a gate of each of the transistors T2, T3, T5, and T6.

The differential CPCS 400A includes a first differential path 402 and a second differential path 404. The first differential path 402 and the second differential path 404 are established between CPCS ports P1+, P1−, P2+, and P2−, which are coupled to multiple antennas (not shown) and CPCS ports P3+ and P3−, which are coupled to a transceiver (not shown). The first switch T1 is coupled between the first differential path 402 and the second differential path 404. For example, the first switch T1 is coupled in shunt to a first sub-path 424 of the first differential path 402 and in shunt to a second sub-path 426 of the second differential path 404 such that the first switch T1 is between the first sub-path 424 and the second sub-path 426. The first sub-path 424 is between the first CPCS port P1+ and the fifth CPCS port P3+. The second sub-path 426 is between the third CPCS port P2+ and the fifth CPCS port P3+. In one aspect of the disclosure, the first switch T1 is coupled between the first resistor R1 and the second resistor R2.

Similarly, the fourth switch T4 is coupled between the first differential path 402 and the second differential path 404. For example, the fourth switch T4 is coupled in shunt to a third sub-path 428 of the first differential path 402 and in shunt to a fourth sub-path 430 of the second differential path 404 such that the fourth switch T4 is between the third sub-path 428 and the fourth sub-path 430. The third sub-path 428 is between the second CPCS port P1− and the sixth CPCS port P3−. The fourth sub-path is between the fourth CPCS port P2− and the sixth CPCS port P3−. In one aspect of the disclosure, the fourth switch T4 is coupled between the third resistor R3 and the fourth resistor R4. The resistors R1, R2, R3, and R4 are isolation resistors to isolate the first differential path 402 from the second differential path 404 (e.g., when the transistors T1 and T4 are enabled or turned on).

In some aspects of the disclosure, the first differential path 402 and the second differential path 404 have a shared path between nodes 414 and 416 and the shared ports P3+ and P3−. For example, the first sub-path 424 and the second sub-path 426 have a first shared sub-path between the node 414 and the fifth CPCS port P3+. The third sub-path 428 and the fourth sub-path 430 have a second shared sub-path between the node 416 and the sixth CPCS port P3−. The first capacitor C1 is coupled in shunt to the first shared sub-path. For example, the first capacitor C1 is coupled between the first shared sub-path and ground 306. The second capacitor C2 is coupled in shunt to the second shared sub-path. For example, the second capacitor C2 is coupled between the second shared sub-path and ground 306.

In one aspect of the disclosure, the differential CPCS 400A includes a first transformer 410 and a second transformer 412. The first transformer 410 is included in the first differential path 402 while the second transformer 412 is included in the second differential path 404. The first transformer 410 inductively couples the first sub-path 424 and the third sub-path 428 of the first differential path 402. The second transformer 412 inductively couples the second sub-path 426 and the fourth sub-path 430 of the second differential path 404. The first transformer 410 may be coupled between the first CPCS port P1+ and the second CPCS port P1− and nodes 414 and 416 of the first differential path 402 and the second differential path 404. The second transformer 412 may be coupled between the third CPCS port P2+ and the fourth CPCS port P2− and nodes 414 and 416 of the first differential path 402 and the second differential path 404.

The second transistor T2 and the fifth transistor T5 are coupled in shunt to the first differential path 402. For example, a drain of the second transistor T2 is coupled to the first sub-path 424, a gate of the second transistor T2 is coupled to the fifth resistor R5 and a source of the second transistor T2 is coupled to ground 306. The gate of the second transistor T2 receives the control signal S2 (e.g., $\overline{Sch1}$) via the fifth resistor R5 or directly. Similarly, a drain of the fifth transistor T5 is coupled to the third sub-path 428, a gate of the fifth transistor T5 is coupled to the sixth resistor R6, and a source of the fifth transistor T5 is coupled to ground 306. The gate of the fifth transistor T5 receives a control signal S5 (e.g., $\overline{Sch1}$) via the sixth resistor R6 or directly.

The third transistor T3 and the sixth transistor T6 are coupled in shunt to the second differential path 404. For example, a drain of the third transistor T3 is coupled to the second sub-path 426, a gate of the third transistor T3 is coupled to the seventh resistor R7, and a source of the third transistor T3 is coupled to ground 306. The gate of the third transistor T3 receives the control signal S3 (e.g., $\overline{Sch2}$) via the seventh resistor R7 or directly. Similarly, a drain of the sixth transistor T6 is coupled to the fourth sub-path 430, a gate of the sixth transistor T6 is coupled to the eighth resistor R8, and a source of the sixth transistor T6 is coupled to ground 306. The gate of the sixth transistor T6 receives a control signal S6 (e.g., $\overline{Sch2}$) via the eighth resistor R8 or directly. Although the transistors are illustrated as NMOS transistors, PMOS transistors are equally applicable to achieve the CPCS 400A. However, when the transistors are PMOS transistors, the control signals to the transistors are changed accordingly.

FIG. 4B illustrates an example of a differential configurable power combiner and splitter (CPCS) 400B in a combining/splitting mode, according to an aspect of the present disclosure. For illustrative purposes, some of the labelling and numbering of the devices and features of FIG. 4B are similar to those of FIG. 4A.

It is to be noted that at lower frequencies, a characteristic of an ON transistor (e.g., N-type field effect transistor) includes a high voltage (e.g., above a threshold voltage) at a gate of the transistor and a large current flowing through the transistor. A characteristic of an OFF transistor (e.g., N-type field effect transistor) includes a low voltage at the gate of the transistor (e.g., below the threshold voltage) and substantially no current flowing through the transistor. A voltage at the gate of a P-type field effect transistor for the ON and OFF transistor characteristics are different than that of the N-type field effect transistor. For example, a characteristic of an ON transistor (e.g., P-type field effect transistor) includes a low voltage (e.g., below a threshold voltage) at a gate of the P-type field effect transistor.

However, at higher frequencies, when the transistor is being used as a switch, the transistor is either closed (and characterized by a low resistance) or open (and characterized as a capacitor). For example, in the open state, the transistor is deemed disabled, meaning that a gate-to-source voltage of the transistor is less than the threshold voltage causing the transistor to act as a capacitor (with capacitance including a parasitic capacitance of the transistor) in the circuit. For example, when the transistor acts as a switch and is open and characterized as a capacitor, a parasitic capacitance of the transistor can include a drain (or source) to substrate capacitance, a drain (or source) to gate capacitance, and/or a parasitic capacitance in a metal oxide semiconductor (MOS) transistor.

In the combining mode (e.g., a high frequency combining mode), the CPCS 400B acts as a conventional Wilkinson combiner with the parasitic capacitance of the transistors T2, T3, T5, and T6, providing a lumped capacitance of the CPCS 400B. For example, in the combining mode the transistors T2, T3, T5, and T6 are open (or turned off when the transistors are used as a switch) and they are characterized as capacitors C3, C4, C5, and C6. The capacitors C3, C4, C5, and C6 may have a same capacitance (e.g., offset capacitance Coff1).

For example, in the combining mode, the first inverted control signal $\overline{Sch1}$ and the second inverted control signal $\overline{Sch2}$ are both zero (0), and the output of the logic device 408 (e.g., inverter) is one. This configuration causes the switches T1 and T4 to be turned on and the transistors T2, T3, T5, and T6 to be turned off. It is to be noted that the transistors T2, T3, T5, and T6 in FIG. 4B are characterized as a capacitors C3, C4, C5, and C6. In this configuration, the CPCS 400B is in the combining mode with both channels (e.g., associated with the first differential path 402 and the second differential path 404) operating.

Turning on the switches T1 and T4 creates a characteristic impedance between the first differential path 402 and the second differential path 404. For example, turning on the switch T1 creates a characteristic impedance between the first sub-path 424 and the second sub-path 426. Similarly, turning on the switch T4 creates a characteristic impedance between the third sub-path 428 and the fourth sub-path 430. The characteristic impedance (usually written Z0) of a uniform transmission line is a ratio of the amplitudes of voltage and current of a single wave propagating along the line. For example, the single wave propagating along the line is a wave travelling in one direction in the absence of reflections in the other direction.

Figure 4C:
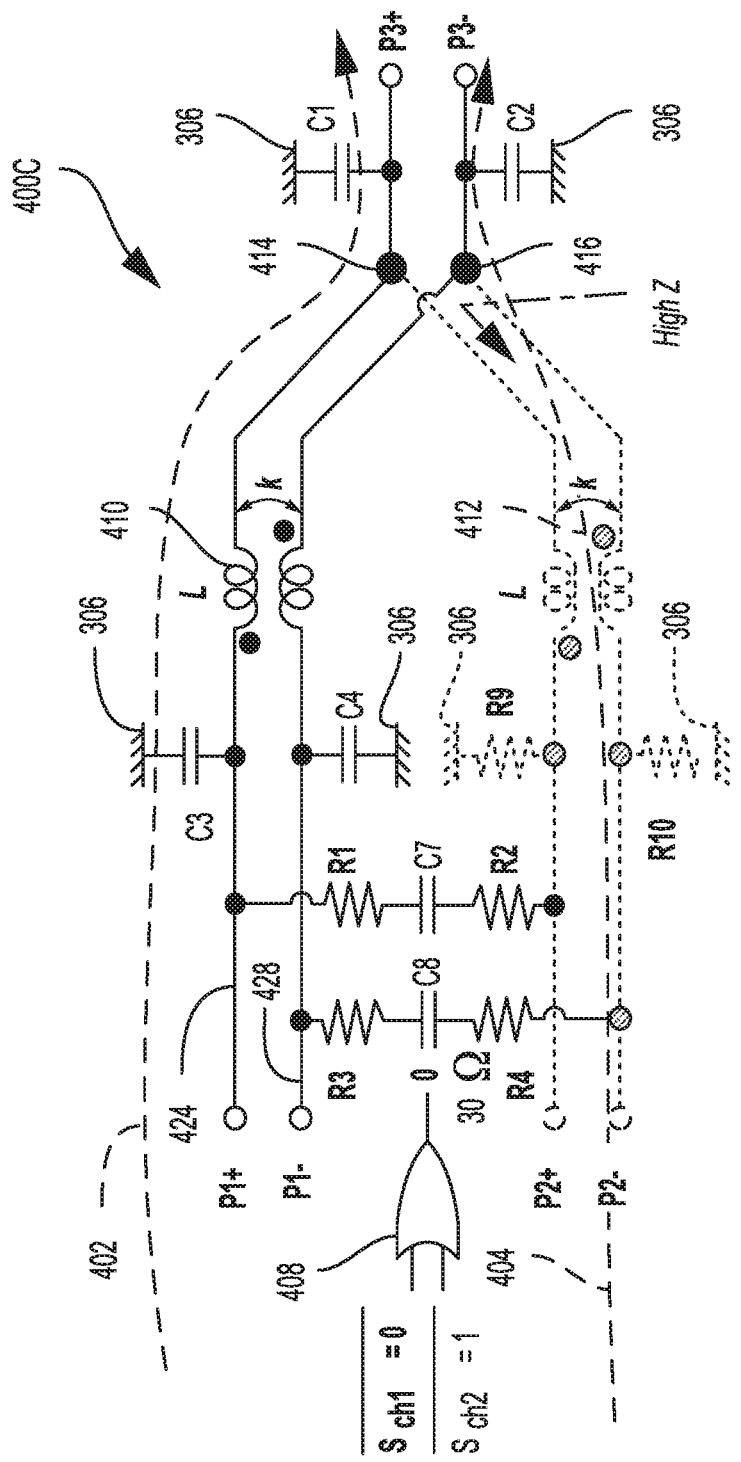
FIG. 4C illustrates an example of a differential configurable power combiner and splitter (CPCS) in a switch mode, according to an aspect of the present disclosure.

FIG. 4C illustrates an example of a differential configurable power combiner and splitter (CPCS) 400C in a switch mode, according to an aspect of the present disclosure. For illustrative purposes, some of the labelling and numbering of the devices and features of FIG. 4C are similar to those of FIG. 4A.

In a switch mode (e.g., high frequency switch mode), the first inverted control signal $\overline{Sch1}$ is zero and the second inverted control signal $\overline{Sch2}$ is one, and the output of the logic device 408 (e.g., inverter) is zero. In this mode, the first switch T1 between the isolation resistors R1 and R2 is opened, which creates a high impedance between the first sub-path 424 and the second sub-path 426. Accordingly, the first switch T1 causes the first sub-path to be decoupled from the third sub-path. It is to be noted that the switch T1 in FIG. 4C is represented by a decoupling capacitor C7. Similarly, the fourth switch T4 between the isolation resistors R3 and R4 is opened, which creates a high impedance between the third sub-path 428 and the fourth sub-path 430. Accordingly, the fourth switch T4 causes the third sub-path 428 to be decoupled from the fourth sub-path 430. It is to be noted that the switch T4 in FIG. 4C is represented by a decoupling capacitor C8.

In the switch mode, the transistors T2 and T5 are open (or turned off when the transistor is used as a switch) and represented as capacitors C3 and C4, respectively. The transistors T3 and T6, however, are closed and are represented by resistances R9 and R10 that short the second differential path 404 to ground 306. For example, in the switch mode, the transistor T3 shorts the second sub-path 426 to ground 306 and the transistor T6 shorts the fourth sub-path 430 to ground 306. Closing the transistors T3 and T6 creates a large impedance (high Z) looking in to unused ports P2+ and P2−. For example, the high impedance can be achieved by parallel resonance of the capacitors C1 and C2 with the windings of the transformer 412 when the windings of the transformer 412 associated with the ports P2+ and P2− are shorted to ground through transistors T3 and T6.

For a same chip area and during a twenty-eight gigahertz (28 GHz) frequency communication, a two-way insertion loss in the combining mode is 0.8 decibels (dB) for the configurable power combiner and splitter, which is essentially the same or slightly more than that of a classical Wilkinson combiner (0.7 dB). Similarly, the eight-way insertion losses for the configurable power combiner and splitter and the classical Wilkinson combiner are similar in the combining mode. For example, the eight-way insertion loss in the combining mode is 2.4 dB for the configurable power combiner and splitter, which is essentially the same or slightly more than that of a classical Wilkinson combiner (2.1 dB).

However, the advantage of the configurable power combiner and splitter over the classical Wilkinson combiner is sharper in the single path or switch mode. For example, in the switch mode, the two-way insertion loss is 1.5 dB for the configurable power combiner and splitter versus 3.7 dB for the classical Wilkinson combiner. This difference is even larger with the eight-way configuration where the insertion loss is 4.5 dB for the configurable power combiner and splitter versus 11.1 dB for the classical Wilkinson combiner. The isolation (e.g., 18 dB) between the ports P1+ or P1− and the ports P2+ or P2− for the configurable power combiner and splitter is almost as good as the isolation (e.g., 20 dB) of a classical Wilkinson combiner implemented with a same fabrication technology and an acceptable tradeoff for the additional benefits of the being able to configure the power combiner as either a combiner/splitter or a switch.

Figure 5:
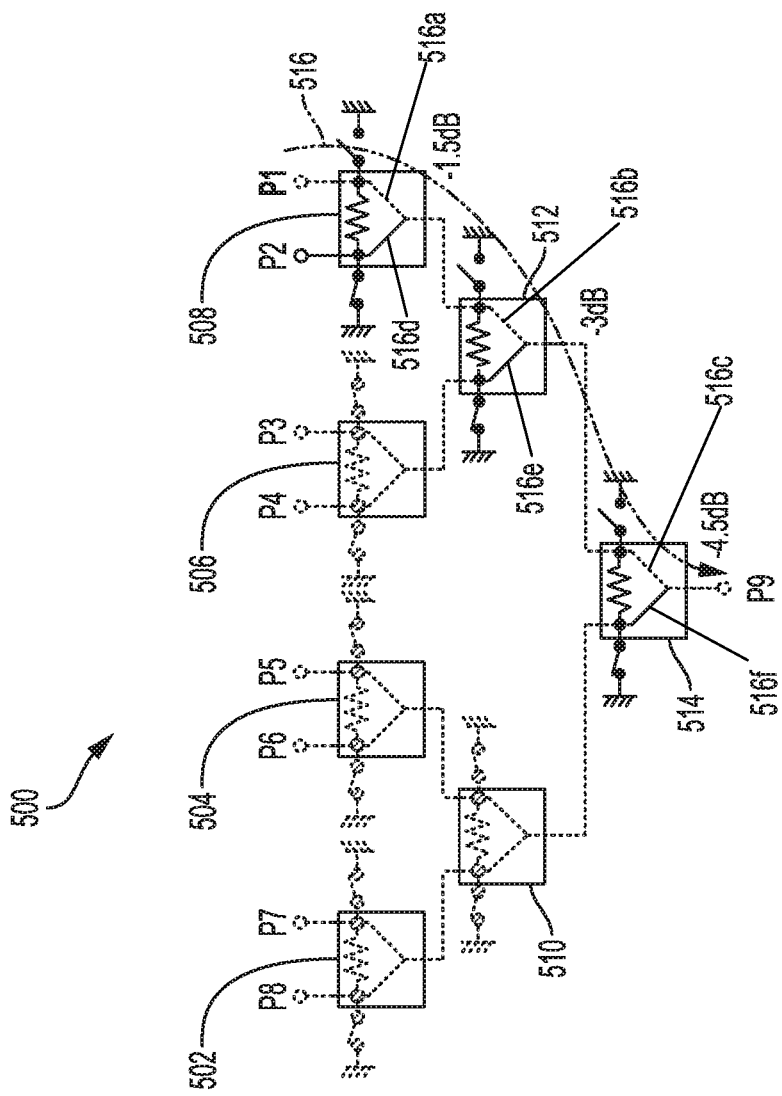
FIG. 5 illustrates an eight-way configurable power combiner and splitter (CPCS), according to aspects of the present disclosure.

FIG. 5 illustrates an eight-way configurable power combiner and splitter (CPCS) 500 according to aspects of the present disclosure. The eight-way CPCS 500 includes a set of first ports P1, P2, P3, P4, P5, P6, P7, and P8 and a second port P9. Some or each of the set of first ports P1, P2, P3, P4, P5, P6, P7, and P8 are connected to different antennas. The eight-way CPCS 500 includes a first two-way CPCS 502, a second two-way CPCS 504, a third two-way CPCS 506 and a fourth two-way CPCS 508. The first two-way CPCS 502 and the second two-way CPCS 504 are coupled to a fifth two-way CPCS 510. The third two-way CPCS 506 and the fourth two-way CPCS 508 are coupled to a sixth two-way CPCS 512. The fifth two-way CPCS 510 and the sixth two-way CPCS 512 are coupled to a seventh two-way CPCS 514.

Each two-way CPCS of the eight-way CPCS 500 may be similar to the CPCS 400A or the CPCS 300. For example, each two-way CPCS of the eight-way CPCS 500 may operate in accordance with a switch mode or a combiner mode such that multiple paths can be selected for communication. In one aspect, a path 516 between port P1 and port P9 may be selected for communication. In this case, the first two-way CPCS 502, the second two-way CPCS 504, and the third two-way CPCS 506 are off or disabled. Disabling all of the paths and sub-paths (as described with respect to FIGS. 4A, 4B and 4C) of each of the first two-way CPCS 502, the second two-way CPCS 504, the third two-way CPCS 506 and the fifth two-way CPCS 510 is similar to disabling all of the paths of the CPCS 300, which includes turning ON the switches T2 and T3 to short the paths 302 and 304 to ground 306.

In some aspects, only some of the paths or sub-paths of the fourth two-way CPCS 508 (through section 516d), the sixth two-way CPCS 512 (through section 516e), and the seventh two-way CPCS 514 (through section 516f) are disabled. When some of the sub-paths or paths are disabled as shown in FIG. 5, the fourth two-way CPCS 508, the sixth two-way CPCS 512 and seventh two-way CPCS 514 are configured in the switch mode. For example, the fourth two-way CPCS 508, the sixth two-way CPCS 512, and the seventh two-way CPCS 514 may each be similar to the CPCS 300. Disabling some of the paths of each of the fourth two-way CPCS 508, the sixth two-way CPCS 512, and the seventh two-way CPCS 514 is similar to disabling a path of the CPCS 300, which includes turning ON the switch T2 to disable the path 302 to the ground 306 while turning OFF the switch T3 so that the signal flows through the path 304. In the case of the fourth two-way CPCS 508, the sixth two-way CPCS 512, and the seventh two-way CPCS 51, the signal flows through the sections 516a, 516b and 516c between ports P1 and P9.

The proposed CPCS significantly reduces path loss. For example, for an eight antenna array, a total loss is only 4.5 dB when a single path (e.g., path 516) is enabled, which saves more than 6 dB compared to a conventional Wilkinson combiner. The eight antenna array may have a set of ports (e.g., P1, P2, P3, P4, P5, P6, P7, and P8) where each port is connected to a different antenna. Moreover, any number of paths or sub-paths (e.g., fourth sub-path 430 of) can be enabled with reduced loss in a same chip area compared to a conventional Wilkinson combiner.

FIG. 6 illustrates an example of a radio frequency integrated circuit (RFIC) architecture 600 including an RFIC 610 and exploded views of two antenna modules into which the radio frequency integrated circuit 610 is integrated. A first antenna module 620 of the two antenna modules is a user equipment (UE) module. A second antenna module 630 of the two antenna modules is a base station module. Each of the antenna modules 620 and 630 includes a flat rectangular sheet or "patch" of metal (or conductive material) 614, mounted over a larger sheet of metal (or conductive material) called a ground plane 616.

The UE module 620 may be a flip chip ball grid array (BGA) UE antenna module with selectable patch and dipole arrays. For example, the UE module 620 uses the RFIC 610 in pairs (e.g., RFIC #1 and RFIC #2) to enable testing of different UE antenna arrays such as 1×4 dipole, 1×4 patch, 2×2 patch, and 2×4 patch. In a base station (BS) array tile, a 4×4 patch array 608 is active with two rows 612 of dummy patches on one edge. The RFIC 610 is divided into six groups of 4-channel sub-arrays, one for each polarization on the top (e.g., first sub-array of antennas 602), right (e.g., second sub-array of antennas 604), and left (e.g., third sub-array of antennas 606) of a die.

A first of the six groups of 4-channel sub-arrays with polarization "A" includes antennas ANT0A, ANT1A, ANT2A, and ANT3A. A second of the six groups of 4-channel sub-arrays with polarization "A" includes antennas ANT4A, ANT5A, ANT6A, and ANT7A. A third of the six groups of 4-channel sub-arrays with polarization "A" includes antennas ANT8A, ANT9A, ANT10A, and ANT 11A. A fourth of the six groups of 4-channel sub-arrays with polarization "B" includes antennas ANT0B, ANT1B, ANT2B, and ANT3B. A fifth of the six groups of 4-channel sub-arrays with polarization "B" includes antennas ANT4B, ANT5B, ANT6B, and ANT7B. A sixth of the six groups of 4-channel sub-arrays with polarization "B" includes antennas ANT8B, ANT9B, ANT10B, and ANT11B.

In one aspect, lumped element Wilkinson power combiners (e.g., 618) are used in the sub-arrays and configurable power combiners/splitters (e.g., 622) are used in the center of the RFIC 610 to allow either combining or switching of the sub-arrays. In a different aspect, lumped element Wilkinson power combiners (e.g. 618) could be replaced by configurable power combiners/splitters (e.g.622). It is a choice for the circuit architecture where to optimally place the configurable power combiner and splitter. For example, one or more of the Wilkinson power combiners can be replaced with one or more configurable power combiners/splitters and vice versa.

Figure 7:
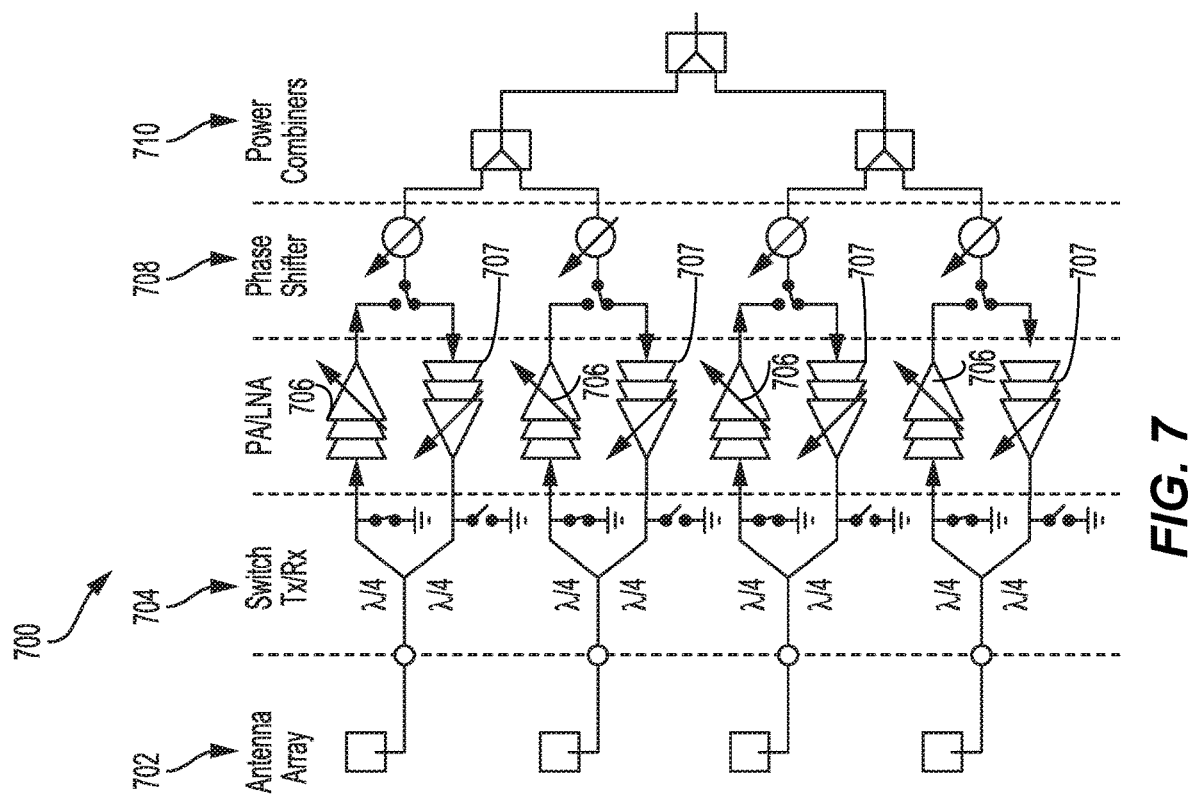
FIG. 7 illustrates an exemplary system including a configurable power combiner and splitter, according to aspects of the present disclosure.

FIG. 7 illustrates an exemplary system 700 including a configurable power combiner and splitter according to aspects of the present disclosure. The system 700 may be configured for a high frequency front-end (e.g., gigahertz frequency range or for fifth generation (5G) front-ends). The system 700 includes antenna array 702, transmit and receive switches 704, low noise amplifiers 706, power amplifiers 707, phase shifters 708, and configurable combiners and splitters 710. The high frequency configurable combiners and splitters 710 may be used for a phased array. It is noted that for a millimeter wave (mmW) phased-array front-end, an in-phase power combiner and splitter network is a key component, especially if beam combining is done at an mmW/radio frequency (RF) path.

In one aspect of the disclosure, a CPCS (e.g., CPCS 400A, CPCS 400B or CPCS 400C) may be configured in accordance with a switch mode or a combiner mode for either transmission using the power amplifiers 707 or reception using the low noise amplifiers 706. In the combiner mode, the first path and the second path are in operation. However, in the switch mode only one path (e.g., the first path or the second path) is in operation. For example, in the switch mode, radio frequency signals for wireless communication are only received or transmitted through the first path or the second path.

Figure 8:
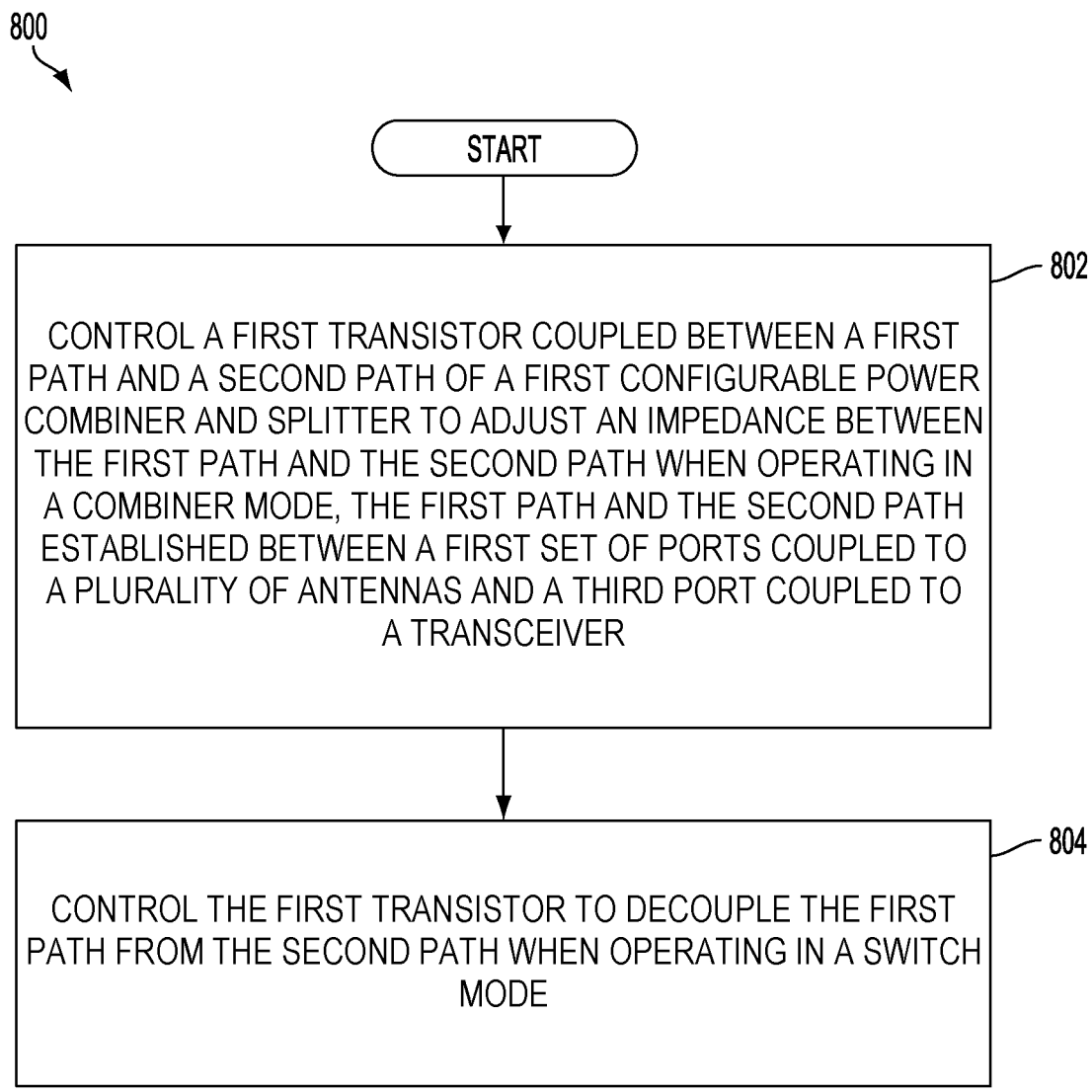
FIG. 8 depicts a simplified flowchart of an impedance matching method for a configurable power combiner and splitter.

FIG. 8 depicts a simplified flowchart of a signal processing circuit operation method 800. At block 802, a first transistor coupled between a first path and a second path of a configurable power combiner and splitter is controlled to adjust an impedance between the first path and the second path when operating in a combiner mode. The first path and the second path are established between a first set of ports coupled to multiple antennas and a third port coupled to a transceiver. At block 804, the first transistor is controlled to decouple the first path from the second path when operating in a switch mode.

According to one aspect of the present disclosure, a signal processing circuit is described. The signal processing circuit includes means for adjusting an impedance between the first path and the second path. The impedance adjusting means may, for example, be the switch or transistor T1, and/or the logic device 408. In another aspect, the aforementioned means may be any module or any apparatus or material configured to perform the functions recited by the aforementioned means.

FIG. 9 is a block diagram showing an exemplary wireless communication system in which a configuration of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925B, and 925C that include the disclosed power combiner and splitter. It will be recognized that other devices may also include the disclosed power combiner and splitter, such as the base stations, switching devices, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the signal processing circuit.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A signal processing circuit, comprising:
   a first pair of differential input ports, comprising a first polarity input port and a second polarity input port;
   a second pair of differential input ports, comprising a first polarity input port and a second polarity input port;
   a third pair of differential output ports, comprising a first polarity output port and a second polarity output port;
   a first common output node coupled between the first polarity input port of the first pair of differential input ports and the first polarity input port of the second pair of differential input ports, and the first common output node coupled to the first polarity output port of the third pair of differential output ports;
   a second common output node coupled between the second polarity input port of the first pair of differential input ports and the second polarity input port of the second pair of differential input ports, and the second common output node coupled to the second polarity output port of the third pair of differential output ports; and
   a first transistor coupled between the first polarity input port of the first pair of differential input ports and the first polarity input port of the second pair of differential input ports, the first transistor configured to receive a first control signal to control the first transistor to adjust an impedance between the first polarity input port of the first pair of differential input ports and the first polarity input port of the second pair of differential input ports.

2. The signal processing circuit of claim 1, further comprising a second transistor coupled between the first polarity input port of the first pair of differential input ports and a ground.

3. The signal processing circuit of claim 1, further comprising a third transistor coupled between the first polarity input port of the second pair of differential input ports and a ground.

4. The signal processing circuit of claim 1, further comprising a first resistor and a second resistor coupled in series with the first transistor.

5. The signal processing circuit of claim 1, in which a second transistor and a fifth transistor are respectively coupled to the first polarity input port and the second polarity input port of the first pair of differential input ports, a third transistor and a sixth transistor are respectively coupled to the first polarity input port and the second polarity input port of the second pair of differential input ports, in which the second transistor and the fifth transistor are controlled by a second control signal and the third transistor and the sixth transistor are controlled by a third control signal.

6. The signal processing circuit of claim 5, in which a fourth transistor is coupled between the second polarity input port of the first pair of differential input ports and the second polarity input port of the second pair of differential input ports, in which the first control signal is configured to control the fourth transistor.

7. The signal processing circuit of claim 5, further comprising a first transformer and a second transformer, in which a first winding and a second winding of the first transformer are respectively coupled between the first pair of differential input ports and the third pair of differential output ports, and in which a third winding and a fourth winding of the second transformer are respectively coupled between the second pair of differential input ports and the third pair of differential output ports.

8. The signal processing circuit of claim 1, in which the first pair of differential input ports and the second pair of differential input ports are coupled to a plurality of antennas and the third pair of differential output ports is coupled to a transceiver.

9. A signal processing circuit operation method comprising:
controlling a first transistor coupled between a first polarity input port of a first pair of differential input ports and a first polarity input port of a second pair of differential input ports of a configurable power combiner and splitter to create an impedance between the first polarity input port of the first pair of differential input ports and the first polarity input of the second pair of differential input ports when operating in a combiner mode, the first pair of differential input ports and the second pair of differential input ports coupled between a plurality of antennas and a third pair of differential output ports are coupled to a transceiver; and
controlling the first transistor to decouple the first pair of differential input ports from the second pair of differential input ports when operating in a switch mode.

10. The signal processing circuit operation method of claim 9, further comprising controlling a second transistor coupled between the first polarity input port of the first pair of differential input ports and a ground to cause the second transistor to disable in the combiner mode or to cause the second transistor to short the first polarity input port of the first pair of differential input ports to ground in the switch mode.

11. The signal processing circuit operation method of claim 10, controlling a third transistor coupled between the first polarity input port of the second pair of differential input ports and the ground to cause the third transistor to disable in the combiner mode or to cause the second transistor to short the first polarity input port of the second pair of differential input ports to ground in the switch mode.

12. The signal processing circuit operation method of claim 9, in which the impedance comprises a characteristic impedance in the combiner mode.

13. A signal processing circuit, comprising:
a first pair of differential input ports, comprising a first polarity input port and a second polarity input port;
a second pair of differential input ports, comprising a first polarity input port and a second polarity input port;
a third pair of differential output ports, comprising a first polarity output port and a second polarity output port;
a first common output node coupled between the first polarity input port of the first pair of differential input ports and the first polarity input port of the second pair of differential input ports, and the first common output node coupled to the first polarity output port of the third pair of differential output ports;
a second common output node coupled between the second polarity input port of the first pair of differential input ports and the second polarity input port of the second pair of differential input ports, and the second common output node coupled to the second polarity output port of the third pair of differential output ports; and
means for adjusting an impedance between the first polarity input port of the first path pair of differential input ports and the second pair of differential input ports, the impedance adjusting means configured to receive a control signal to cause the impedance adjusting means to adjust the impedance between the first polarity input port of the first pair of differential input ports and the first polarity input port of the second pair of differential input ports.

14. The signal processing circuit of claim 13, further comprising a transistor coupled between the first polarity input port of the first pair of differential input ports and a ground.

15. The signal processing circuit of claim 13, further comprising a transistor coupled between the first polarity input port of the second pair of differential input ports and a ground.

16. The signal processing circuit of claim 13, further comprising a first resistor and a second resistor coupled in series with the impedance adjusting means.

* * * * *